(12) United States Patent
Allegato et al.

(10) Patent No.: US 9,327,964 B2
(45) Date of Patent: May 3, 2016

(54) METHOD FOR MANUFACTURING A DIE ASSEMBLY HAVING A SMALL THICKNESS AND DIE ASSEMBLY RELATING THERETO

(71) Applicant: STMicroelectronics S.r.l., Agrate Brianza (IT)

(72) Inventors: Giorgio Allegato, Monza (IT); Marco Ferrera, Concorezzo (IT); Matteo Garavaglia, Magenta (IT); Lorenzo Corso, Ruginello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/524,661

(22) Filed: Oct. 27, 2014

(65) Prior Publication Data
US 2015/0115378 A1    Apr. 30, 2015

(30) Foreign Application Priority Data

Oct. 31, 2013   (IT) .............................. TO2013A0889

(51) Int. Cl.
*B81B 7/00* (2006.01)
*B81C 1/00* (2006.01)

(52) U.S. Cl.
CPC ........... *B81B 7/0074* (2013.01); *B81C 1/00238* (2013.01); *B81C 1/00325* (2013.01); *B81B 2201/0235* (2013.01); *B81B 2201/0242* (2013.01); *B81B 2207/012* (2013.01); *B81B 2207/097* (2013.01); *B81C 2203/0118* (2013.01); *B81C 2203/0792* (2013.01)

(58) Field of Classification Search
CPC ............ B81B 7/0074; B81B 2207/012; B81B 2207/097; B81B 2201/0242; B81B 2201/0235; B81C 1/00238; B81C 1/00325; B81C 2203/0792; B81C 2203/0118
See application file for complete search history.

(56) References Cited

U.S. PATENT DOCUMENTS

| | | | |
|---|---|---|---|
| 2007/0176280 A1* | 8/2007 | Do et al. ........................ | 257/692 |
| 2010/0176466 A1 | 7/2010 | Fujii et al. | |
| 2011/0012214 A1* | 1/2011 | Beer et al. ..................... | 257/418 |
| 2011/0127670 A1* | 6/2011 | Perng et al. .................. | 257/738 |
| 2011/0227175 A1* | 9/2011 | Gupta et al. .................. | 257/415 |
| 2013/0043547 A1* | 2/2013 | Chu ........................ | H01L 24/81 257/415 |
| 2013/0168740 A1* | 7/2013 | Chen ............................. | 257/254 |

* cited by examiner

*Primary Examiner* — Michelle Mandala
(74) *Attorney, Agent, or Firm* — Seed IP Law Group PLLC (57) ABSTRACT

A method for manufacturing a die assembly, including the steps of: bonding a first wafer of semiconductor material to a second wafer, the second wafer including a respective semiconductor body having a respective initial thickness and forming an integrated electronic circuit; and subsequently reducing the initial thickness of the semiconductor body of the second wafer; and subsequently bonding the second wafer to a third wafer, the third wafer forming a micro-electromechanical sensing structure.

11 Claims, 11 Drawing Sheets

METHOD FOR MANUFACTURING A DIE ASSEMBLY HAVING A SMALL THICKNESS AND DIE ASSEMBLY RELATING THERETO

BACKGROUND

1. Technical Field

The present disclosure relates to a method for manufacturing a die assembly and to the die assembly thus obtained.

2. Description of the Related Art

Figure 1:
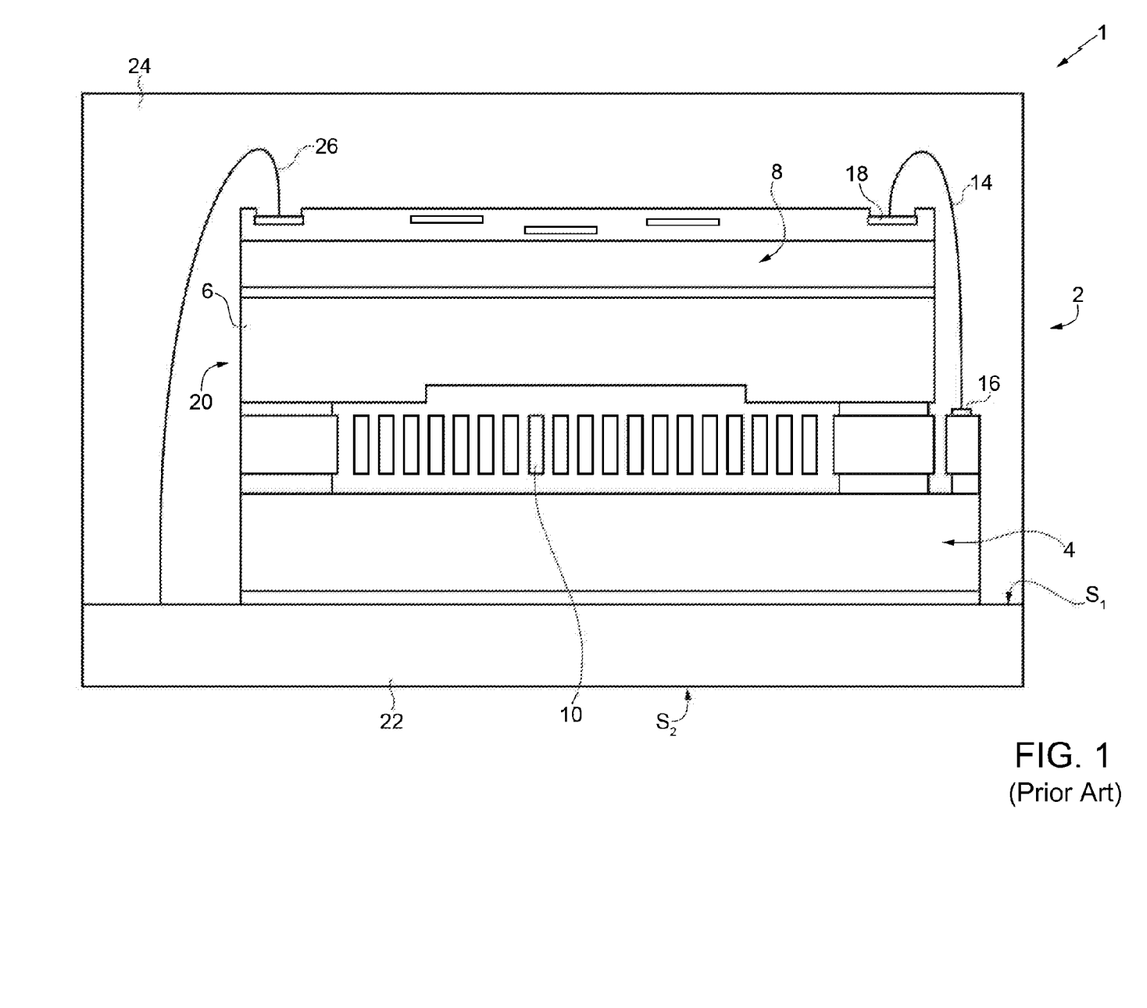
FIG. 1 is a schematic illustration of a cross-section of an assembly of a known type.

As is known, today so-called MEMS (micro-electromechanical system) sensors are available, an example of which is illustrated in FIG. 1.

In particular, FIG. 1 shows a MEMS sensor 1, which is formed by a package 2, provided inside which are a first die 4, a second die 6, and a third die 8.

The first die 4 forms a so-called sensitive structure 10 of a MEMS type, also known as sensing structure, which comprises one or more elements that are mobile, or in any case deformable, following upon the action of forces that act on the MEMS sensor 1; the sensitive structure 10 is thus designed to generate an electrical sensing signal, which is a function of said forces.

The first die 4 is overlaid by the second die 6, which functions as cap of the sensitive structure 10 and, as such, may not have electrical functions.

In turn, the second die 6 is overlaid by the third die 8 comprising an ASIC (application specific integrated circuit), also known as "read circuit", which is designed to receive and process the electrical sensing signal so as to generate an output signal. The first and third dice 4, 8 are connected together typically by wire bondings 14 set between pads 16 of the first die 4 and pads 18 of the third die 8.

The first, second, and third dice 4, 6, 8 thus form an assembly 20, which is carried by a supporting layer 22 and is coated with a coating 24, such as, for example, a coating of resin, known as "molding compound". The supporting layer 22 is delimited by a first surface $S_1$, arranged on top of which is the assembly 20, and by a second surface $S_2$.

On the first surface $S_1$ and, in the case of a package of the so-called "land grid array" (LGA) type, also on the second surface $S_2$ of the supporting layer 22 pads are provided (not illustrated), connected together, for example, by vias or metallizations that extend through the supporting layer 22.

The third die 8 is electrically connected to one or more of the pads provided on the first surface $S_1$, by corresponding wire bondings 26. Consequently, the third die 8 is electrically connected to the pads provided on the second surface $S_2$ and may thus be electrically connected to the outside world.

The assembly 20 is today very widespread since it may be manufactured in a simple and reliable way. For this purpose, in fact, it is possible to bond together a first wafer and a second wafer of semiconductor material, which form, respectively, the first and second dice 4, 6, and singulate the two-wafer structure thus formed so as to form a subassembly including precisely the first and second dice 4, 6. The third die 8, previously singulated, is bonded to the subassembly. However, the assembly 20 has a thickness that is not particularly small given that the operations of bonding between dice require that the latter have thicknesses of not less than (approximately) 100 μm in order to prevent the dice from cracking during the machining steps. Furthermore, the use of dice having small thicknesses entails a degradation of the performance of the sensitive structure on account of a greater sensitivity thereof to the stresses caused by the machining steps, as well as to the stresses that arise during use (for example, thermal stresses).

BRIEF SUMMARY

According to one or more embodiments of the disclosure there is provided a method for manufacturing a die assembly and a die assembly.

BRIEF DESCRIPTION OF THE SEVERAL VIEWS OF THE DRAWINGS

For a better understanding of the disclosure, embodiments thereof are now described purely by way of non-limiting example and with reference to the attached drawings, wherein.

DETAILED DESCRIPTION

Figure 2:
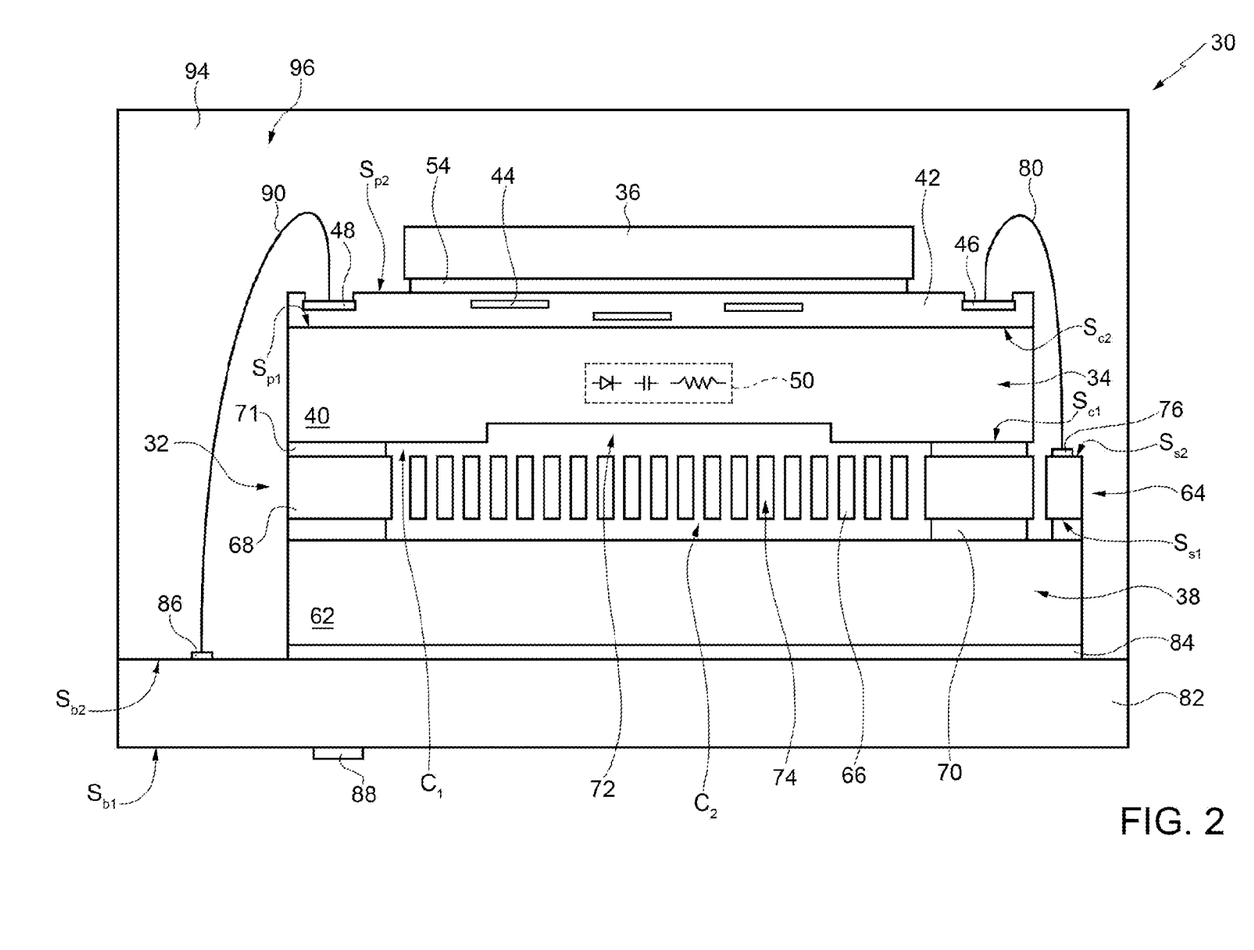
FIG. 2 is a schematic illustration of a cross-section of an assembly according to an embodiment of the present disclosure.

The present manufacturing method is described in what follows with reference, purely by way of example, to manufacture of the electronic sensor illustrated in FIG. 2. In particular, FIG. 2 shows an electronic sensor 30, which includes an assembly 32 formed by a first die 34, a second die 36, and a third die 38, which are stacked vertically.

The first die 34 is arranged between the second and third dice 36, 38 and is formed by a first body 40 of semiconductor material (for example, silicon), referred to hereinafter as "first die body 40". The first die body 40 is delimited by a first body surface $S_{c1}$ and a second body surface $S_{c2}$ and includes a substrate of semiconductor material, as well as, possibly, one or more epitaxial layers (not illustrated); further, the first die body 40 has a thickness, for example, in the range 50 μm-150 μm.

The first die 34 further comprises a passivation region 42, referred to as the "die passivation region 42". The die passivation region 42 is arranged on top of the first die body 40, with which it is in direct contact, and is formed by dielectric material. In a per se known manner, within the die passivation region 42 there extend metallizations 44. Further, the die passivation region 42 is delimited by a first passivation surface $S_{p1}$ and a second passivation surface $S_{p2}$, the first passivation surface $S_{p1}$ being arranged in contact with the first die body 40, and in particular with the second body surface $S_{c2}$.

Extending on the second passivation surface $S_{p2}$ are a first plurality of pads 46 and a second plurality of pads 48 of conductive material, even though in FIG. 1, for reasons of simplicity, just one corresponding pad will be illustrated for each of these first and second pluralities of pads. In particular, the pads of the first and second pluralities of pads 46, 48 extend, each, within a corresponding recess formed by the second passivation surface $S_{p2}$, this recess being open and extending underneath an envelope defined by the second passivation surface $S_{p2}$, this envelope being planar and coinciding with the second passivation surface $S_{p2}$ itself, but for the recesses.

Formed within the first die body 40 is an electronic circuit 50, of a type per se known, referred to hereinafter as "processing circuit 50". The processing circuit 50 is electrically connected to the first and second pluralities of pads 46, 48 by metallizations 44.

The second die 36 is bonded to the die passivation region 42 by interposition of a first bonding layer 54, of a per se known type and formed, for example, by a material chosen from among: polyimide, a glass, a metal alloy, a dry resist, or else any other adhesive material. The first bonding layer 54 is arranged on top of the second passivation surface $S_{p2}$.

The second die 36 is thus bonded to the front side of the first die 34. Furthermore, the second die 36 has a particularly reduced thickness, ranging, for example, between 20 μm-100 μm.

Operatively, the second die 36 does not have electrical functions. Thus, it does not form any PN junction, is without an own passivation region, and is electrically uncoupled from the first and third dice 34, 38, in the sense that it cannot exchange electrical signals with the latter dice. In other words, the second die 36 performs an exclusively mechanical function; in fact, the second die 36 imparts stiffness on the assembly 32 and enables, for the reasons that will be clarified hereinafter, bonding of the first die 34 to the third die 38 notwithstanding the fact that the first die body 40 has a small thickness.

The third die 38 includes a second body 62 of semiconductor material, referred to hereinafter as "second die body 62". The second die body 62 is formed by a respective substrate and may include one or more epitaxial layers. Furthermore, the third die 38 forms a sensing structure 74, which includes, without any loss of generality, a mobile element designed to move, or in any case undergo deformation, following upon the action of a force, not necessarily a real force, acting on the electronic sensor 30.

Purely by way of example, in the embodiment illustrated in FIG. 2, the mobile element is formed by a structural layer, referred to hereinafter as "functional layer 64", which is, for example, of semiconductor material and includes a central portion 66 and a peripheral portion 68. The peripheral portion 68 is bonded, through one or more anchorages 70, to the underlying second die body 62, whilst the central portion 66 overlies, at a distance, the second die body 62.

The central portion 66 forms the aforementioned mobile element and is suspended between a first cavity $C_1$, delimited by the central portion 66 and by the first die body 40, and a second cavity $C_2$, delimited by the central portion 66 and by the second die body 62.

In greater detail, the functional layer 64 is delimited by a first layer surface $S_{s1}$, facing the second die body 62, and by a second layer surface $S_{s2}$, facing the first die 34. Furthermore, the first die 34 is bonded to the third die 38 by a second bonding layer 71, arranged on top of the peripheral portion 68 of the functional layer 64 and, for example, of a material chosen from among: polyimide, a glass, a metal alloy, a dry resist, or else any other adhesive material. In practice, the backside of the first die 34 is bonded to the front side of the third die 38. Furthermore, the second bonding layer 71, the functional layer 64, and the anchorages 70 may form a hermetically closed environment, present inside which is the aforementioned central portion 66.

Without any loss of generality, the first body surface $S_{c1}$ forms a cap recess 72, having, for example, the shape of a parallelepiped and giving out onto the central portion 66 of the functional layer 64. In other words, the cap recess 72 is an integral part of the first cavity $C_1$. Furthermore, once again without any loss of generality, the sensing structure 74 is of the type present, for example, in MEMS accelerometers and/or gyroscopes and/or resonators of a known type, or else in any MEMS device that can be interfaced to a control electronics. Consequently, the sensing structure 74 includes the central portion 66 of the functional layer 64, as well as one or more electrodes (not illustrated).

Extending on the second layer surface $S_{s2}$ is a third plurality of pads 76 of conductive material, which are connected to corresponding pads of the first plurality of pads 46 by corresponding wire bondings 80 (illustrated in FIG. 2 is just one of said bonds). Further, the pads of the third plurality of pads 76 are connected to the electrodes of the sensing structure 74. In this way, the processing circuit 50 can bias the sensing structure 74, which generates, in use, an electrical sensing signal, indicating the force acting on the electronic sensor 30. Furthermore, the processing circuit 50 receives the electrical sensing signal, on the basis of which it generates an electrical output signal.

The electronic sensor 30 further comprises a supporting structure 82, of dielectric material and delimited by a first supporting surface $S_{b1}$ and a second supporting surface $S_{b2}$, the second supporting surface $S_{b2}$ facing the third die 38. The third die 38 is bonded to the supporting structure 82 by interposition of a third bonding layer 84, formed by an adhesive film.

Extending on the second supporting surface $S_{b2}$ and underneath the first supporting surface $S_{b1}$ are, respectively, a fourth plurality of pads 86 and a fifth plurality of pads 88, even though in FIG. 2, for reasons of simplicity, just one corresponding pad is illustrated, for each of these pluralities.

The pads of the fourth and fifth pluralities of pads 86, 88 are electrically connected to one another, for example through metallizations (not illustrated) that extend through the supporting structure 82. Furthermore, the pads of the second and fourth pluralities of pads 48, 86 are connected together by corresponding wire bondings 90. In this way, the electrical output signal is made available on one or more of the pads of the fifth plurality of pads 88.

The electronic sensor 30 further comprises a coating 94 of a known type and for example of resin, which coats the assembly 32 and forms a package 96 together with the supporting structure 82.

Given the foregoing, the assembly 32 may be formed using the manufacturing method that will be described in what follows with reference to FIGS. 3-15, where indicated by a dashed line are the positions of two scribe lines WL. The dimensions of the elements illustrated in FIGS. 3-15 are not in scale with the dimensions of the elements themselves, as illustrated in FIG. 2. Furthermore, for reasons of simplicity, the manufacturing method is described with reference to limited portions of the wafers involved in the method itself.

Figure 3:
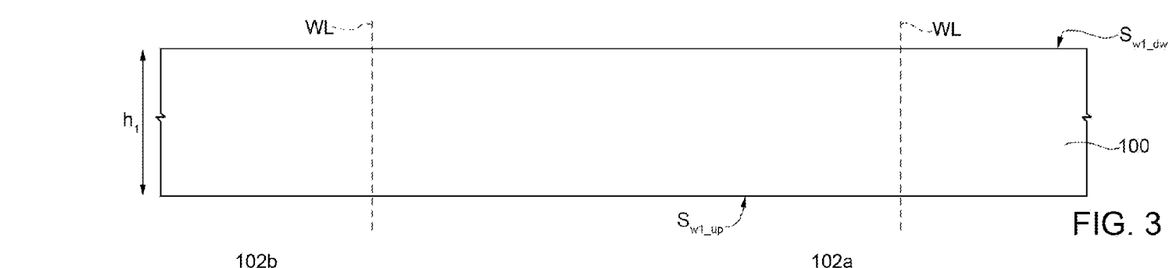
FIGS. 3-15 are schematic cross-sections of an assembly, during steps of the present manufacturing method.

As illustrated in FIG. 3, a first wafer 100 of semiconductor material is initially provided, which does not have electrical functions and is delimited by a first wafer top surface $S_{w1\_up}$ and by a first wafer bottom surface $S_{w1\_dw}$. The first wafer 100 has a first initial thickness $h_1$, for example of 725 μm. In this connection, in the present description, the terms "top/bottom" and "overlying/underlying" are used, except where otherwise specified, with reference to the arrangement illustrated in FIG. 2, thus irrespective of whether, during the manufacturing operations, the wafers and the corresponding surfaces assume temporarily orientations different from what is illustrated in FIG. 2.

Figure 4:
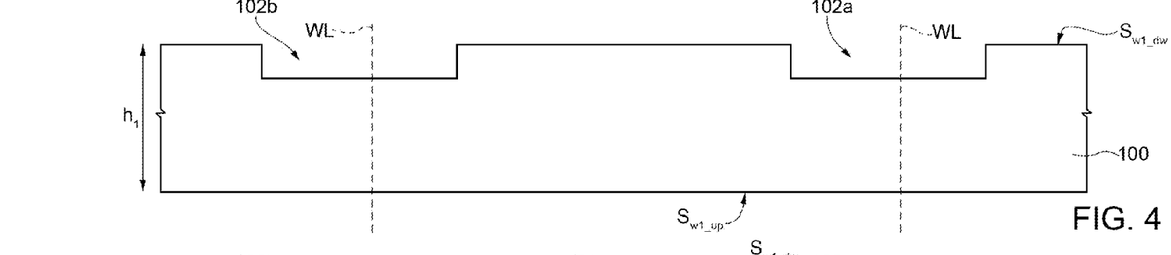

As illustrated in FIG. 4, portions of the first wafer 100 are selectively removed, for example by an etch of a dry or wet type, which is carried out starting from the first wafer bottom surface $S_{w1\_dw}$. In this way, a first recess 102a and a second recess 102b are formed, referred to hereinafter as "first and second process recesses 102a, 102b". The first and second process recesses 102a, 102b extend from the first wafer bottom surface $S_{w1\_dw}$.

Figure 5:
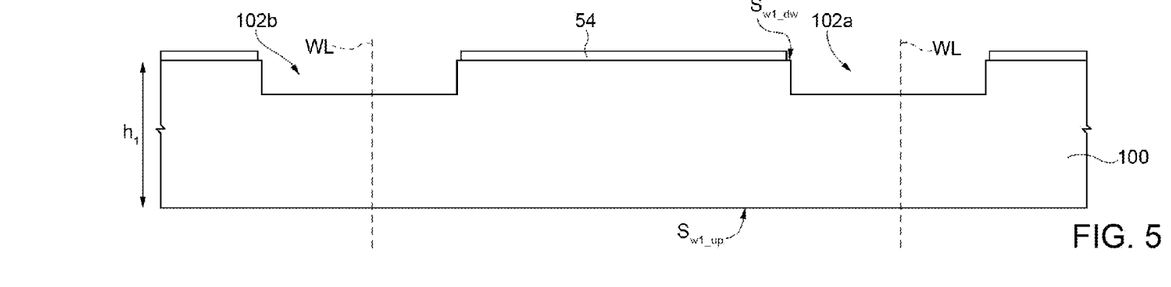

As illustrated in FIG. 5, the first bonding layer 54 is formed in contact with the first wafer bottom surface $S_{w1\_dw}$. For this purpose, it is possible for the first bonding layer 54 to be initially laid on the first wafer bottom surface $S_{w1\_dw}$, and subsequently portions thereof will be selectively removed. Alternatively, it is possible for the first bonding layer 54 to be formed already shaped on the first wafer bottom surface $S_{w1\_dw}$, for example in the case where the first bonding layer 54 is formed by a resist, a glass frit, or a metallization.

Figure 6:
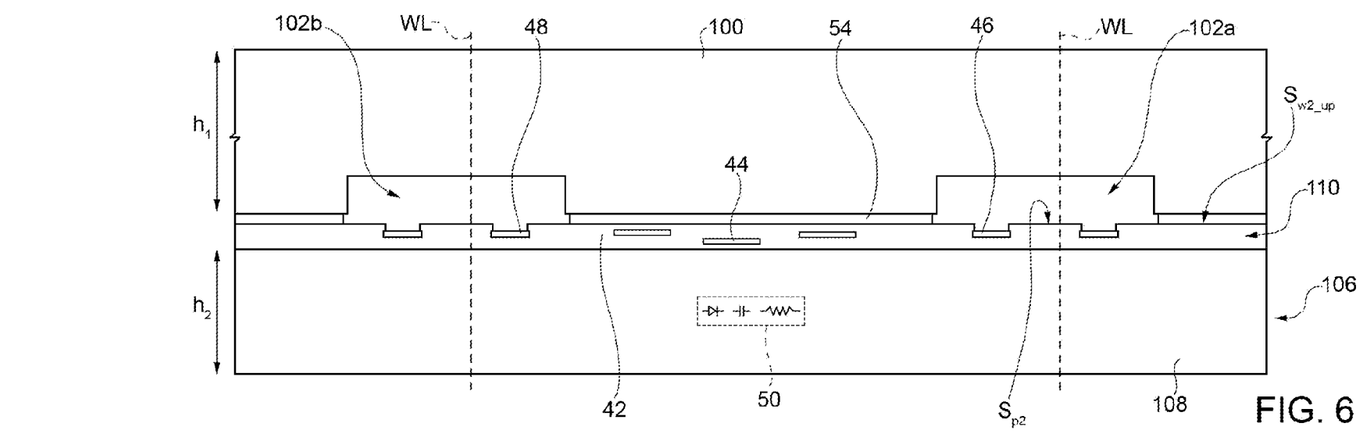

As illustrated in FIG. 6, a permanent bonding of a wafer-to-wafer type is carried out between the first wafer 100 and a second wafer 106, by the first bonding layer 54 so as to form a subassembly. This bonding is of a type per se known and may for example be a glass-frit bonding, or else a bonding based upon use of a soldering paste, a metal alloy, or a resist, or else, once again by way of example, a thermocompression bonding, according to the material or materials that form the first bonding layer 54. Furthermore, during the operations of bonding there may be carried out, in a per se known manner, thermal treatments, and the first bonding layer 54 may undergo modifications.

The second wafer 106 comprises a respective body 108 of semiconductor material and a respective passivation region 110, referred to hereinafter, respectively, as "first wafer body 108" and "wafer passivation region 110".

The wafer passivation region 110 is delimited at the top by a second wafer top surface $S_{w2\_up}$, includes the die passivation region 42 and consequently defines also the second passivation surface $S_{p2}$. Furthermore, already present on the second wafer top surface $S_{w2\_up}$ are the aforementioned first and second pluralities of pads 46, 48. In addition, already present within the first wafer body 108 is the processing circuit 50. The first wafer body 108 has a thickness $h_2$ comprised, for example, between 300 µm and 725 µm.

Figure 7:
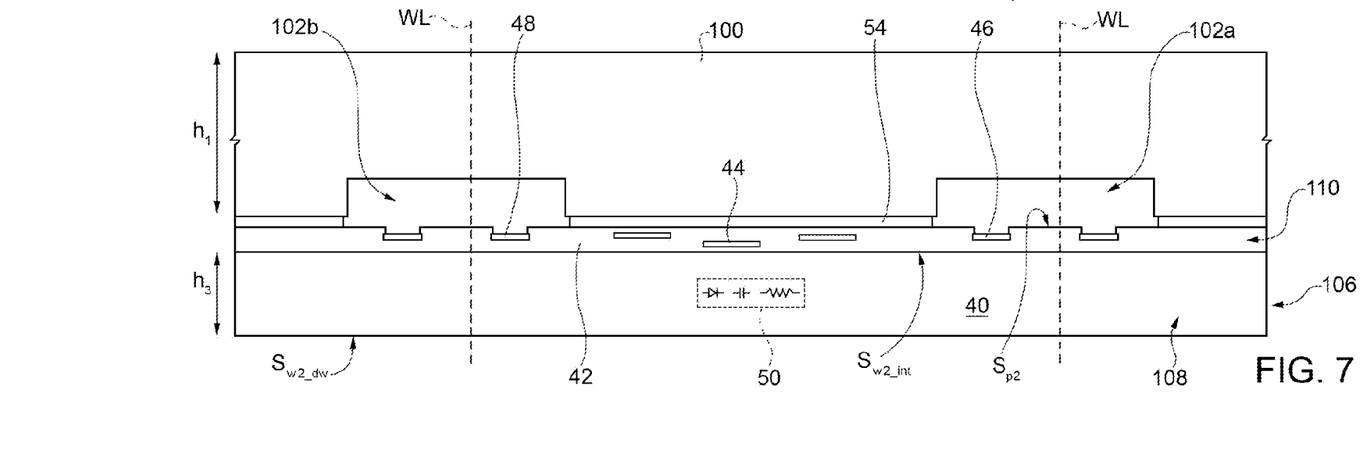

As illustrated in FIG. 7, the thickness $h_2$ of the first wafer body 108 is reduced, for example, by an operation of backside grinding. In this way, the first wafer body 108 assumes a thickness $h_3$ comprised, for example, between 50 µm and 150 µm.

Furthermore, the first wafer body 108 forms the first die body 40, but for the cap recess 72, and is delimited by a second wafer intermediate surface $S_{w2\_int}$, arranged in contact with the wafer passivation region 110, and by a second wafer bottom surface $S_{w2\_dw}$.

Figure 8:
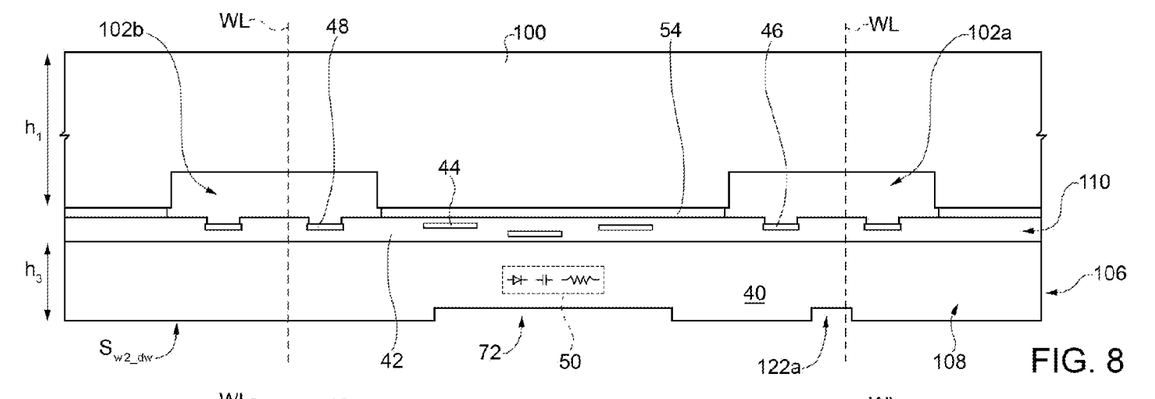

As illustrated in FIG. 8, portions of the first wafer body 108 are selectively removed, for example, by an etch of a dry or wet type, starting from the second wafer bottom surface $S_{w2\_dw}$. In this way, the cap recess 72 is formed, as well as a third process recess 122a, which is laterally staggered with respect to the cap recess 72 and is overlaid by the first process recess 102a. Furthermore, the third process recess 122a is laterally staggered with respect to the pads of the first plurality of pads 46; in particular, in top plan view, the pads of the first plurality of pads 46 are arranged between the cap recess 72 and the third process recess 122a.

Figure 9:
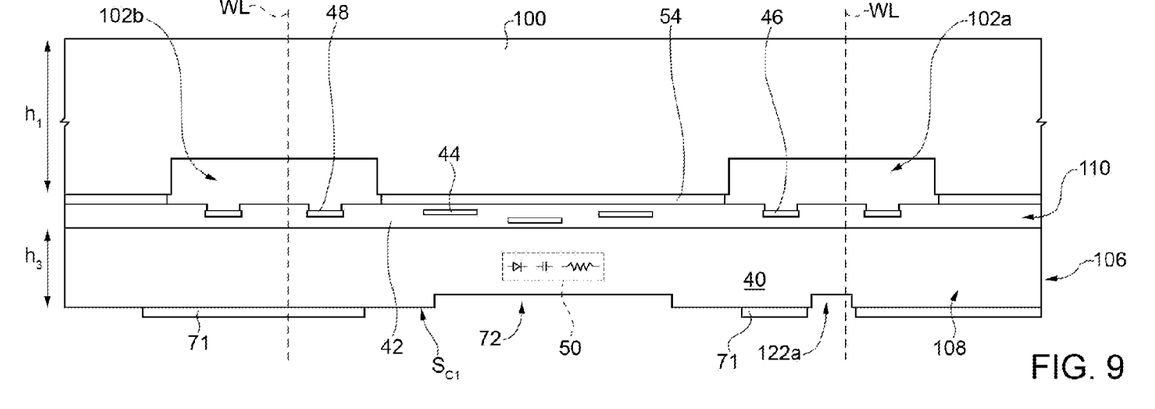

As illustrated in FIG. 9, the second bonding layer 71 is formed underneath the first wafer body 108. The second bonding layer 71 is formed in contact with the first wafer body 108 and in particular with portions of the first wafer body 108 that form the first body surface $S_{c1}$.

Figure 10:
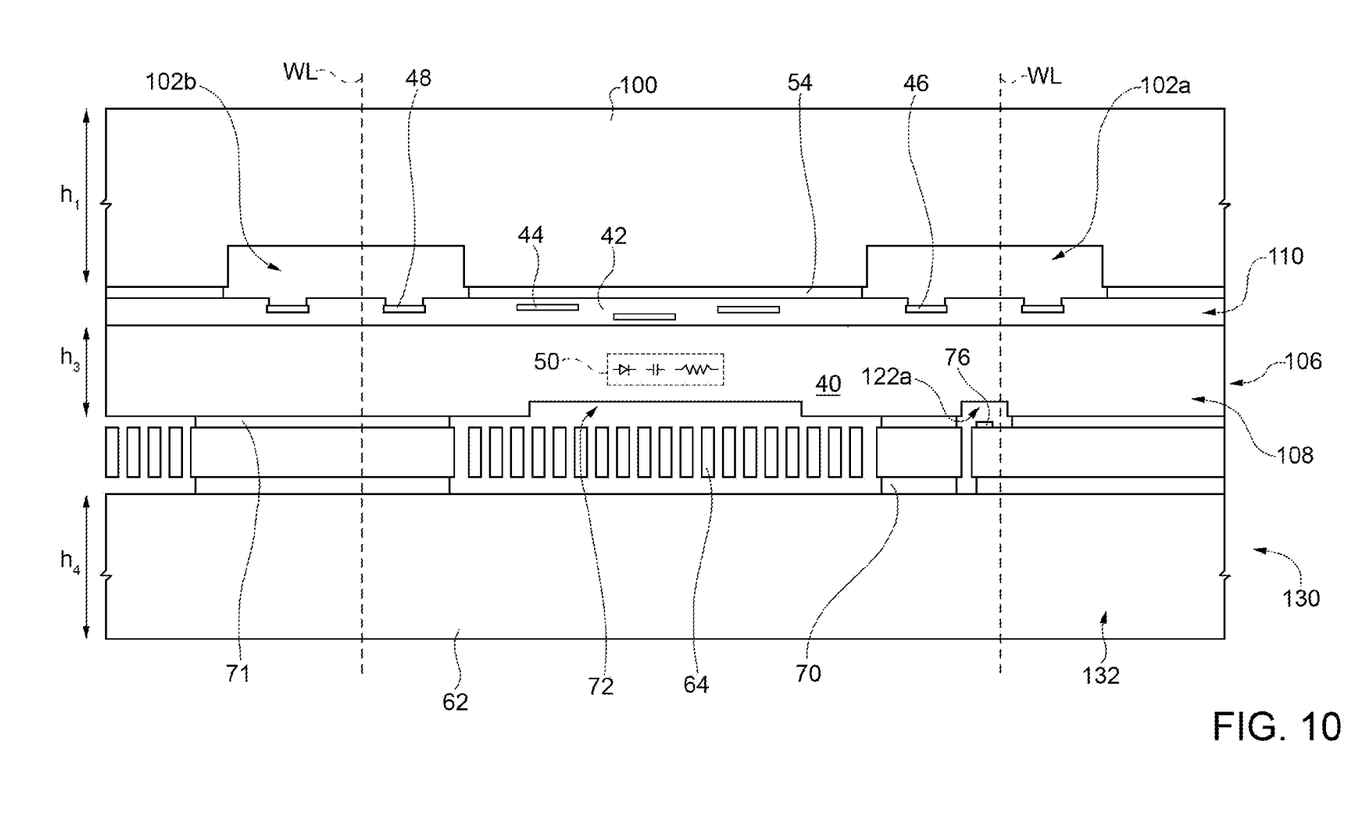

As illustrated in FIG. 10, a permanent wafer-to-wafer bonding is carried out between the second wafer 106 and a third wafer 130 by the second bonding layer 71. This bonding is of a type per se known and may, for example, be a glass-fit bonding, or else a bonding based upon the use of a soldering paste, a metal alloy, a resist, or else, once again by way of example, a thermocompression bonding, according to the material or materials that form the second bonding layer 71. Furthermore, during the operations of bonding there may be carried out, in a per se known manner, thermal treatments, and the second bonding layer 71 may undergo modifications.

The third wafer 130 is formed in a per se known manner and comprises a respective body 132 of semiconductor material, referred to hereinafter as "second wafer body 132". The second wafer body 132 has a thickness $h_4$, for example, between 300 µm and 725 µm and forms the second die body 62. The third wafer 130 further comprises the functional layer 64, the anchorages 70, and the pads of the aforementioned third plurality of pads 76, which give out onto the third process recess 122a.

Figure 11:
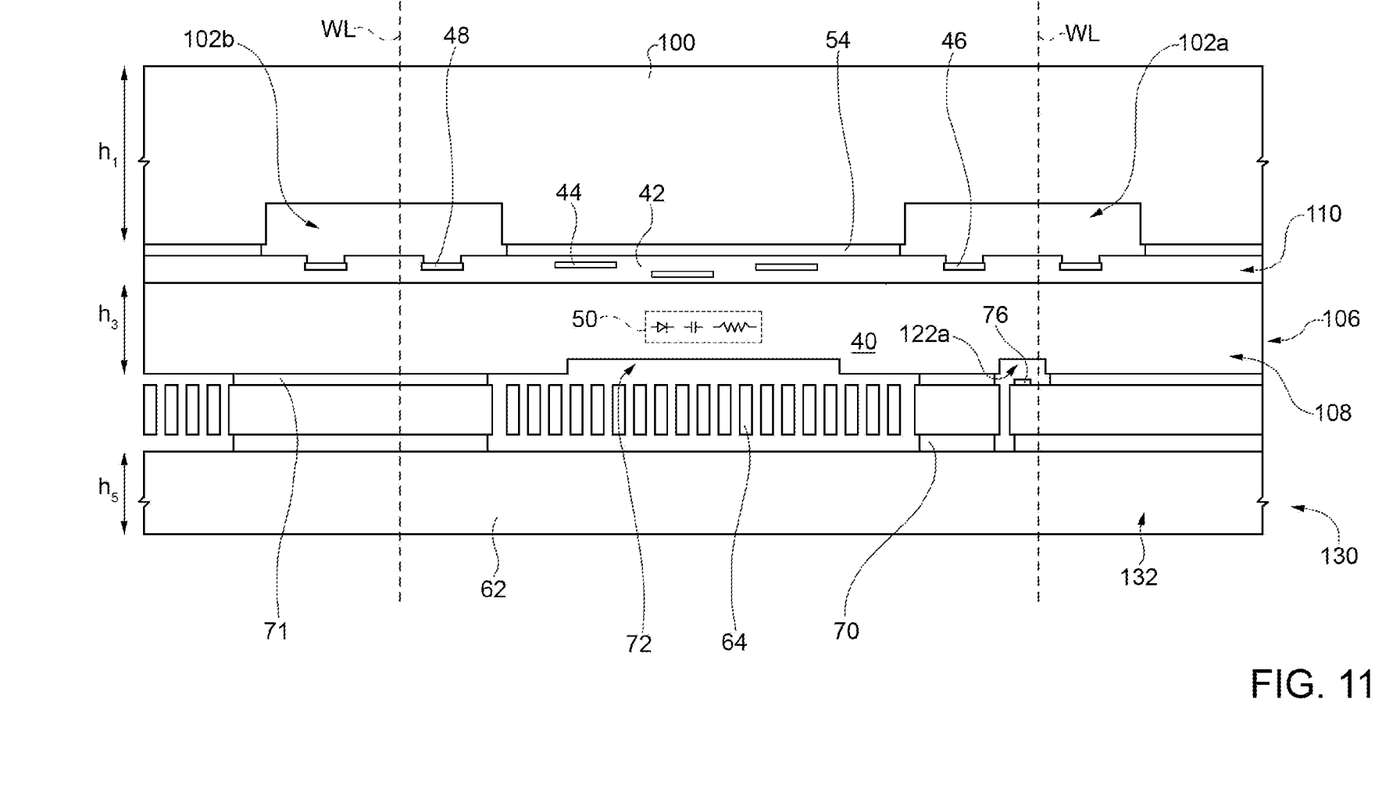

As illustrated in FIG. 11, back-lapping of the third wafer 130 is carried out in such a way that the second wafer body 132 assumes a thickness $h_5$, comprised, for example, between 100 µm and 300 µm.

Figure 12:
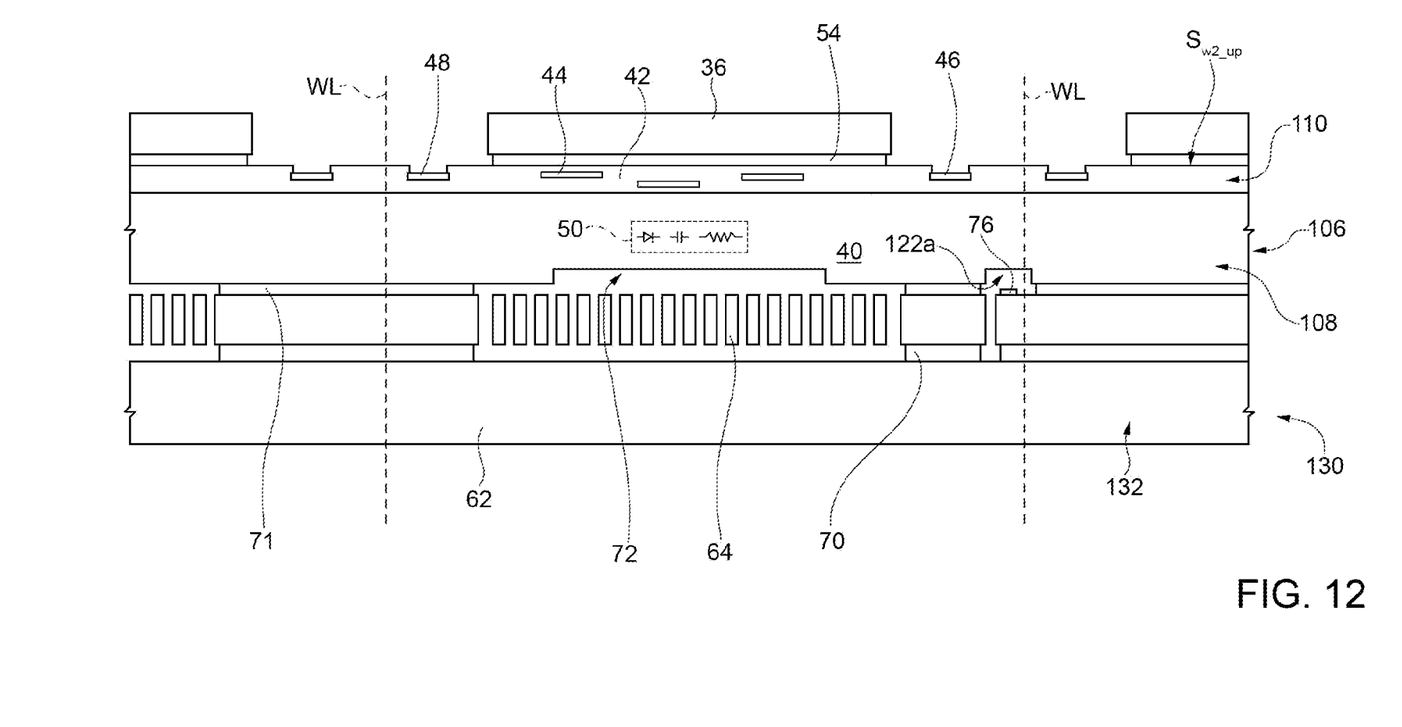

As illustrated in FIG. 12, an operation of lapping of the first wafer 100 is carried out, i.e., a uniform reduction of the thickness of the first wafer 100, so as to form, insulating it, the second die 36. In this way, the pads of the first and second pluralities of pads 46, 48 are exposed, as on the other hand also a part of the passivation region 110 of the second wafer 106, this part being laterally staggered with respect to the pads of the first plurality of pads 46 and overlying the third process recess 122a.

Figure 13:
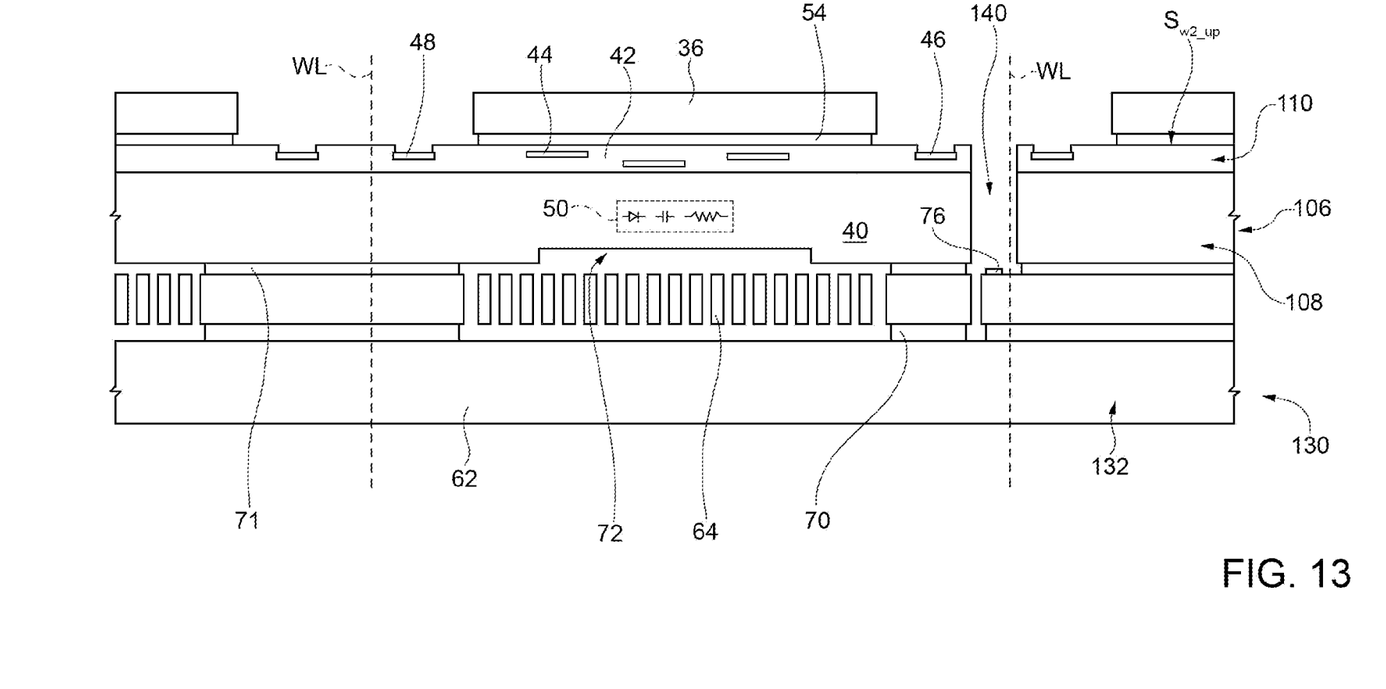

As illustrated in FIG. 13, a sawing process is carried out so as to remove selectively portions of the first wafer body 108, as well as the overlying portions of the wafer passivation region 110. In particular, the sawing process entails removal of a portion of the exposed part of the passivation region 110, this portion being arranged on top of the third process recess 122a, as well as removal of an underlying portion of the first wafer body 108. For instance, the sawing process may be substantially aligned with the side walls of the third process recess 122a.

In practice, the sawing process entails formation of a through cavity 140, which traverses completely both the wafer passivation region 110 and the first wafer body 108, in such a way that it is, for example, possible to connect the pads of the third plurality of pads 76 to corresponding pads of the first plurality of pads 46 by corresponding wire bondings extending through the through cavity 140.

In a per se known manner, operations (not illustrated) are carried out that lead to the formation of the electronic sensor 30 illustrated in FIG. 2; these operations comprise, amongst other things, operations of sawing along the scribe lines WL.

The manufacturing method described further enables formation of electronic sensors of a type different from the electronic sensor 30, such as, for example, electronic sensors in which wire bondings 90 are absent, but within the second die body 62 conductive vias are present (not illustrated). In this case, the electrical output signal is sent from the first die 34 to the third die 38 through some of the wire bondings 80 set between pads of the first and third pluralities of pads 76; then, the electrical output signal passes through one or more of the aforementioned vias.

The present manufacturing method may further be used to form an electronic sensor where the wire bondings 90 are absent, and where the electrical connection between the processing circuit 50 and the sensing structure 74 is obtained by one or more conductive vias that extend through the first die body 40. In this case, also the aforementioned pads of the first and second pluralities of pads 46, 48 may be absent. In fact, the electrical sensing signal is supplied to the processing circuit 50 through one or more of the vias that extend through the first die body 40, and the electrical output signal is supplied to the third die 38 through one or more of the vias that extend through the first die body 40. Further, the electrical output signal is subsequently made available on the outside of the assembly through one or more wire bondings that extend from pads formed in the third die 38, or else through one or more conductive vias that extend through the second die body 62.

The advantages that the present manufacturing method affords emerge clearly from the foregoing description. In fact, the present manufacturing method enables reliable formation of assemblies having a small thickness and including MEMS sensing structures, which, due to the stiffness of these assemblies, are characterized by a high stability of performance.

In particular, the present manufacturing method enables formation of an assembly including three dice and having an overall thickness of up to 100 µm smaller as compared to the known art. This is due to the fact that the first die 34 may be bonded to the third die 38 albeit having a small thickness, due to the prior bonding of the first die 34 itself to the second die 36, or rather due to the prior bonding of the corresponding wafers.

The present manufacturing method further enables formation of an assembly in which the presence of the second die 36 does not affect the overall height of the assembly 32, measured, for example, starting from the second supporting surface $S_{b2}$. In fact, the maximum height of the second die 36 may be set so as to be not greater than the maximum height of the wire bondings 80 that connect the first die 34 to the third die 38, as well as the wire bondings 90 that connect the first die 34 to the outside world.

In addition, the presence of the second die 36 enables increase in the stiffness of the assembly 32, and in particular of the second body 62, without increasing the total thickness of the assembly 32. In this way, the sensitive structure 74 is less sensitive to the mechanical stresses to which it is subjected during the manufacturing process, as well as during normal use, these stresses being able cause drifts of the electrical signals generated within the sensitive structure 74 itself.

The present manufacturing method further enables protection of the front side of the first die 34 during the so-called "back-end operations", such as, for example, the pick-and-place operations and molding operations.

Finally, it is evident that modifications and variations may be made to the manufacturing method described and to the assembly thus formed, without thereby departing from the scope of the present disclosure.

For instance, the second die 36 may be biased at a reference potential by the first die 34. Furthermore, the sensing structure formed by the third die 38 may differ from what is illustrated and described herein.

It is further possible for the steps of lapping of the third wafer 130 and of the first wafer 100, illustrated in FIGS. 11 and 12 respectively, to be performed in reverse order. Furthermore, lapping of the first wafer 100 may be carried out prior to bonding of the second and third wafers 106, 130.

Figure 14:
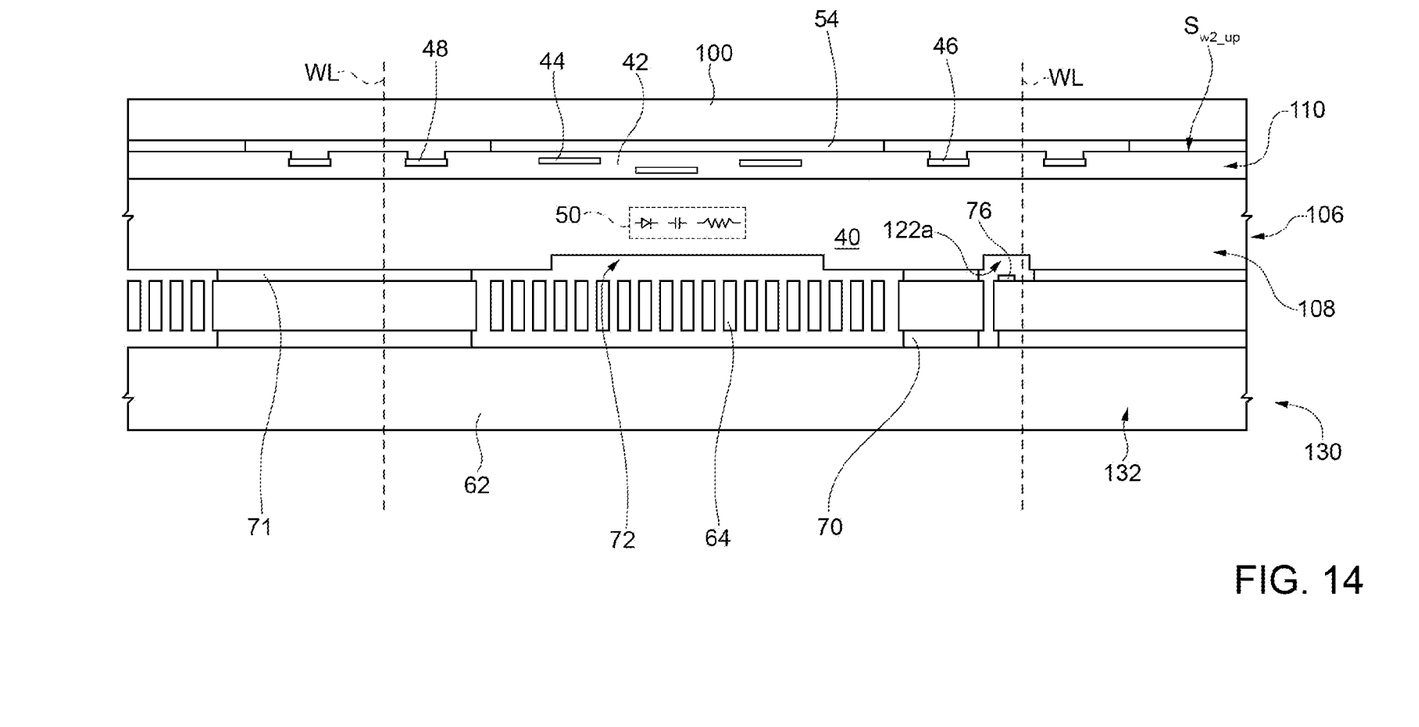

In addition, it is possible for the pads of the first and second pluralities of pads 46, 48 to be exposed by a selective removal of portions of the first wafer 100, for example, by an operation of lithography and subsequent etching, instead of during the operations of lapping of the first wafer 100. In this case, the first and second recesses 102a, 102b may not be formed. Consequently, as illustrated in FIG. 14, during manufacture there arises a situation in which the first wafer 100, after being lapped, has a uniform thickness comprised between 20 µm and 100 µm, is without recesses, and overlies the wafer passivation region 110.

By a dry etch, the pads of the first plurality of pads 46 and a part of the passivation region 110 of the second wafer 106 are exposed so as to obtain what is illustrated in FIG. 12. A portion of the exposed part of the passivation region 110 is removed, together with the underlying portion of the first wafer body 108, during the sawing process illustrated in FIG. 13. In this connection, further, the backside grinding of the first wafer body 108 may be carried out either prior to exposure of the first plurality of pads 46 or after (case not illustrated). Furthermore, in general, exposure of the pads of the first plurality of pads 46 and of the part of the passivation region 110 of the second wafer 106 may be carried out before the second wafer 106 is bonded to the third wafer 130.

As regards the through cavity 140, this may be formed with an etching process, for example, a dry etch, of the second wafer 106, instead of with the sawing process; in this case, the third process recess 122a may not be formed since it performs the function of spacing apart, during the sawing operations, the third plurality of pads 76 from the first wafer body 108, and thus from the blade. On the other hand, the third process recess 122a is optional also in the case where the sawing process is adopted since it is in any case possible to space apart the third plurality of pads 76 from the first wafer body 108 by increasing the thickness of the second bonding layer 71.

Etching of the second wafer 106 may be carried out after exposing the pads of the first plurality of pads 46 and the aforementioned part of the passivation region 110, not necessarily after the second and third wafers 106, 130 have been bonded together. In this case, etching may be carried out starting from the top surface of the second wafer $S_{w2\_up}$.

Figure 15:
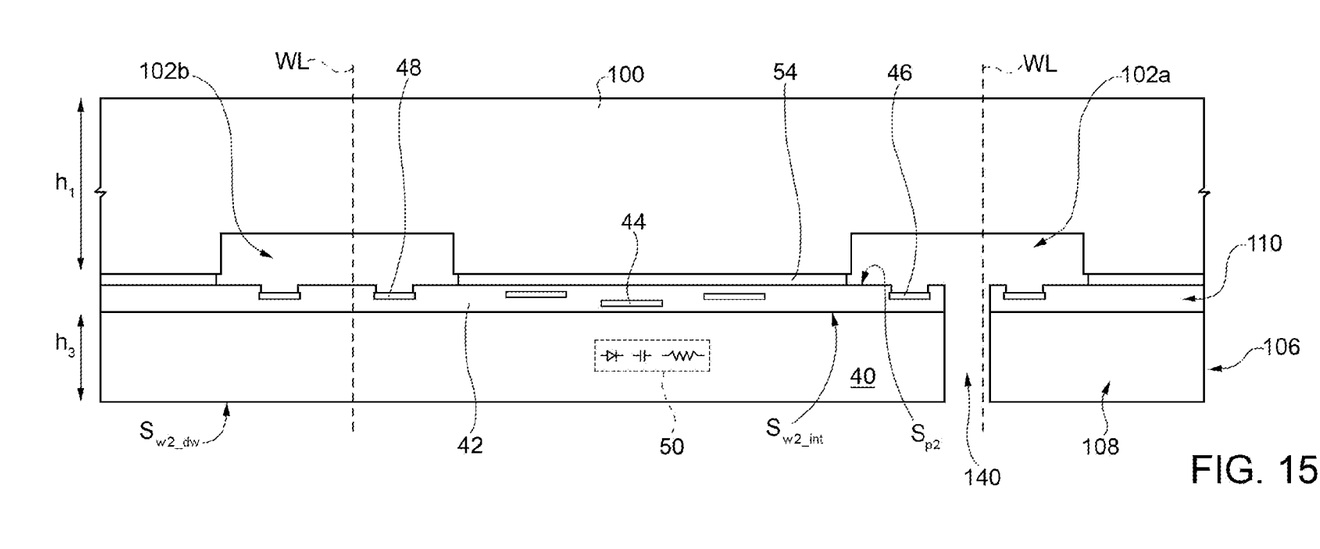

Alternatively, etching may be carried out after the first and second wafers 100, 106 have been bonded together (possibly, even before reducing the thickness $h_2$ of the first wafer body 108), but prior to bonding of the second and third wafers 106, 130 together. In this case, etching is carried out starting from the second wafer bottom surface $S_{w2\_dw}$ and may precede exposure of the first plurality of pads 46 and the aforementioned part of the passivation region 110, as illustrated in FIG. 15, where it is further assumed, by way of example, that etching precedes formation of the cap recess 72.

Finally, even though in the present description reference has been made to a package of a so-called LGA type, i.e., to a package in which present underneath the supporting structure are one or more pads, it is possible to apply the present manufacturing method also to packages of a different type, such as for example packages of a ball grid array (BGA), quad-flat no-leads (QFN), or chip-scale (CSP) type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A die assembly comprising:
    a first die including a semiconductor body and an integrated electronic circuit and having first and second sides that extend between first and second surfaces;
    a recess formed in the first surface of the first die;
    a second die of semiconductor material bonded to the second surface of the first die, the second die not including electrical functions and providing stiffening structural support to the first die;

a third die bonded to the first surface of the first die, the first die being arranged between the second and third dice, the third die including a micro-electromechanical sensing structure; and a molding compound coating the first and second sides of the first die.

2. The assembly according to claim 1, wherein the integrated electronic circuit is electrically coupled to the micro-electromechanical sensing structure, the second die being mechanically coupled to the first and third dice and configured to not receive electrical signals generated by the first die or the third die.

3. The assembly according to claim 1, wherein the second die is not electrically coupled to the first and third dice.

4. The assembly according to claim 1, wherein the second die has a thickness between 20 μm and 100 μm.

5. The assembly according to claim 1, wherein the semiconductor body of the first die has a thickness between 50 μm and 150 μm.

6. The assembly according to claim 1, wherein the second die is made entirely of semiconductor material.

7. The assembly according to claim 1, wherein the first die includes a first pad of conductive material, and wherein the third die includes a second pad of conductive material; the assembly further comprising a first wire bonding that electrically connects the first pad to the second pad, the first wire bonding having a maximum height that is greater than a maximum height of the second die.

8. A package comprising:
an assembly including:
a first semiconductor die having a first surface and a second surface, the first die including an integrated electronic circuit;
a second die of semiconductor material bonded to the first surface of the first die, the second die not including electrical structures; and
a third die bonded to the second surface the first die, the first die being arranged between the second and third dice, the third die including a micro-electromechanical sensing structure;
a first conductive wire electrically coupling the first die to the third die; and
molding compound around side portions of the first, second, and third dice and the first conductive wire.

9. The package of claim 8, further comprising:
a supporting structure coupled to a surface of the third die; and
a second conductive wire electrically coupling the first die to the supporting structure, the second conductive wire having a maximum height that is greater than a maximum height of the second die.

10. The package of claim 9, further comprising:
a plurality of bond pads on the second surface of the first die; and
an outer perimeter of the second die being between the plurality of bond pads.

11. The die assembly of claim 1, further comprising:
a plurality of bond pads on the first surface of the first die; and
an outer perimeter of the second die being between the plurality of bond pads.

* * * * *